(12) United States Patent
Matsushita

(10) Patent No.: US 6,911,852 B2
(45) Date of Patent: Jun. 28, 2005

(54) START-UP CIRCUIT

(75) Inventor: Yuichi Matsushita, Miyazaki (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 0 days.

(21) Appl. No.: 10/745,685

(22) Filed: Dec. 29, 2003

(65) Prior Publication Data
US 2004/0135558 A1 Jul. 15, 2004

Related U.S. Application Data

(62) Division of application No. 10/252,682, filed on Sep. 24, 2002, now Pat. No. 6,693,471.

(30) Foreign Application Priority Data

Sep. 26, 2001 (JP) ........................................ 2001-293892

(51) Int. Cl.⁷ ................................................ H03L 7/00
(52) U.S. Cl. ...................................... 327/143; 327/198
(58) Field of Search ................................. 327/143, 198, 327/142

(56) References Cited
U.S. PATENT DOCUMENTS 4,009,399 A * 2/1977 Hofer .......................... 327/132
5,892,381 A 4/1999 Koifman et al. ............. 327/198
6,285,223 B1 9/2001 Smith .......................... 327/143
6,597,215 B2 7/2003 Wang .......................... 327/143
6,693,471 B2 * 2/2004 Matsushita ................... 327/143

* cited by examiner

Primary Examiner—Dinh T. Le
(74) Attorney, Agent, or Firm—Volentine Francos & Whitt PLLC

(57) ABSTRACT

A start-up circuit includes a power supply node which receives a power supply voltage, a ground node which receives a ground voltage, a first node, a first capacitor which is coupled between the first node and the ground node, a supply circuit which is coupled between the power supply node and the first node, and which supplies an electrical charge from the power supply node to the first capacitor, a discharge circuit which is coupled between the first node and the ground node, and which discharges an electrical charge stored in the first capacitor to the ground node, and an output circuit which is connected to the first node, and which outputs a start-up signal when a voltage level of the first node becomes higher than a set voltage level.

12 Claims, 4 Drawing Sheets

START-UP CIRCUIT

CROSS REFERENCE TO RELATED APPLICATION

This is a divisional of U.S. patent application Ser. No. 10/252,682, filed Sep. 24, 2002, now U.S. Pat. No. 6,693,471, which claims priority under 35 U.S.C. §119 to Japanese Patent Application No. 2001-293892, filed Sep. 26, 2001, which is herein incorporated by reference in its entirely for all purposes.

BACKGROUND OF THE INVENTION

1. Field of the Invention

The present invention relates to a start-up circuit, and more particularly to a start-up circuit generating and outputting an initialization signal which initializes an internal circuit of a semiconductor integrated circuit when a power supply voltage is supplied to the internal circuit.

2. Description of the Related Art

FIG. 5 is a circuit diagram showing a conventional start-up circuit 500. The conventional start-up circuit 500 includes a power supply node T1 to which is a power supply voltage VCC, a ground node T2 to which a ground voltage GND, a node n1, a PMOS transistor 501 located between the power supply node T1 and the node n1, a condenser C51 located between the node n1 and the ground node T2, an inverter INV1 having PMOS and NMOS transistors 503 and 505, an inverter INV2 having PMOS and NMOS transistors 507 and 509, and an output node ST. The inverter INV1 is located between the power supply and ground nodes T1 and T2, and receives a signal from the node n1. The inverter INV2 is located between the power supply and ground nodes T1 and T2, and receives an output signal of the inverter INV1.

Charging of the condenser C51 starts when the power supply voltage VCC is supplied to the power supply node T1. Then, a voltage level of the node n1 rises in response to a time constant on the basis of an ON state resistance of the PMOS transistor 501 and a capacity of the condenser C51. Since a charged voltage level of the condenser C51 is low right after the power supply voltage VCC is supplied to the power supply node T1, the voltage level of the node n1 is initially a low ("L") level. As a result, since the PMOS transistor 503 assumes an ON state and the NMOS 505 assumes an OFF state, an output signal of the inverter INV1 is a high ("H") level. Therefore, the PMOS transistor 507 of the inverter INV2 assumes an OFF state and the NMOS transistor 509 assumes an ON state, and then an "L" level signal is outputted from the output node ST. Then, the condenser C51 is further charged. A "H" level signal is eventually outputted from the output node ST after the voltage level of the node n1 becomes higher than a threshold voltage level of the inverter INV1.

Accordingly, after the power supply voltage VCC is supplied to the power supply node T1, the voltage level of the output node ST is maintained at an "L" level for a certain period in response to the time constant, and is then switched to an "H" level after the certain period. An initialization of an internal circuit which is connected to the output node ST is performed during the certain period that the voltage level of the output node ST is at the "L" level.

An electrical charge stored in the condenser C51 discharges to the power supply node T1 through the PMOS transistor 501, when a supply of the power supply voltage VCC to the power supply node T1 is (interrupted) stopped.

However, during a discharge of the condenser C51 of the conventional start-up circuit, since the PMOS transistor 501 switches to an off state when a voltage level of the node n1 falls to a threshold voltage level of the PMOS transistor 501, an electrical charge having the threshold voltage level of the PMOS transistor 501 is still held in the condenser C51. Such an electrical charge discharges during a state in which the power supply voltage VCC is disrupted. However, a discharging time of the electrical charge becomes to longer. Also, since the electrical charge stored in the condenser C51 does not discharge quickly when the power supply voltage VCC is disrupted, an electrical potential is held at the node n1. Then, if a supply of the power supply voltage VCC is resumed, the voltage level of the node n1 exceeds the threshold voltage level of the inverter INV1 before initialization of the internal circuit. As a result, an "H" level signal is outputted from the output node ST before the internal circuit can be initialized properly.

SUMMARY OF THE INVENTION

The present invention is therefore directed to providing a start-up circuit which substantially overcomes one or more of the problems due to the limitations and disadvantages of the related art.

It is an objective of the invention to provide a start-up circuit, in which a power supply node which receives a power supply voltage, a ground node which receives a ground voltage, a first node, a first capacitor which is located between the first node and the ground node, a supply circuit which is located between the power supply node and the first node, and which supplies an electrical charge from the power supply node to the first capacitor, a discharge circuit which is located between the first node and the ground node, and which discharges an electrical charge stored in the first capacitor to the ground node, and an output circuit which is connected to the first node, and which outputs a start-up signal when a voltage level of the first node becomes higher than a set voltage level.

According to the present invention, even though the supply of the power supply voltage to the power supply node is disrupted, a period of charging the electrical charge into the condenser can be sufficiently secured. Therefore, a period of initializing the internal circuit electrically connected to the output node ST can be sufficiently secured.

The present invention can shorten the recovery period from the release of the disruption of the supply of the power supply voltage, until the termination of the reset signal. Therefore, the present invention can achieve a reduction in power consumption of the integrated circuit.

The above and further objects and novel features of the invention will become more fully apparent from the following detailed description, appended claims and accompanying drawings herein.

BRIEF DESCRIPTION OF THE DRAWINGS

While the specification concludes with claims particularly pointing out and distinctly claiming the subject matter which is regarded as the invention, it is believed that the invention, the objects and features of the invention and further objects, features and advantages thereof will be better understood from the following description taken in connection with the accompanying drawings in which:

DETAILED DESCRIPTION OF THE PREFERRED EMBODIMENTS

Preferred embodiments of the present invention will hereinafter be described in detail with reference to the accompanying drawings. The drawings used for this description typically illustrate major characteristic parts to facilitate understanding of the invention.

Figure 1:
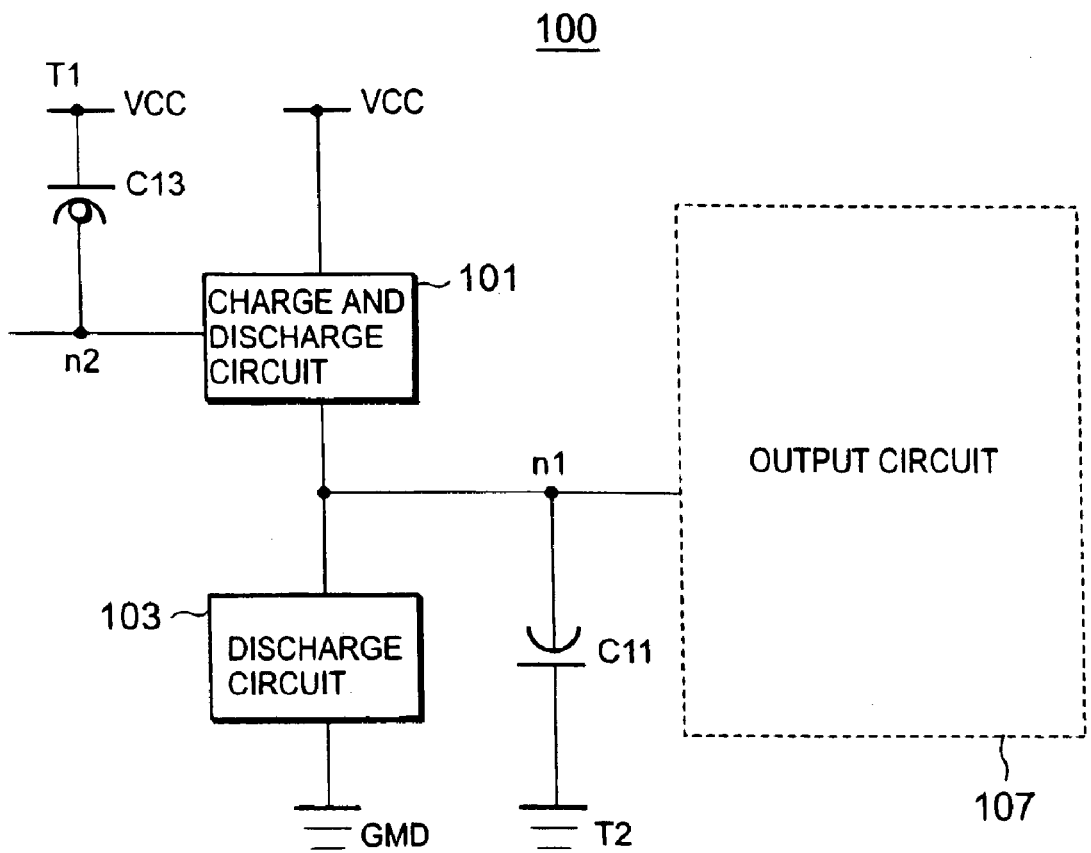
FIG. 1 is a block diagram showing a relevant part of a start-up circuit according to a preferred embodiment of the present invention.

FIG. 1 is a block diagram showing a relevant part of a start-up circuit 100 according to a preferred embodiment of the present invention. As shown in FIG. 1, the start-up circuit 100 includes a power supply node T1 to which is applied a power supply voltage VCC, a ground node T2 to which is applied a ground voltage GND, nodes n1 and n2, a condenser C11 which is located between the node n1 and the ground node T2 and which is charged by an electrical charge from the power supply node T1, a condenser C13 which is located between the power supply node T1 and the node n2 and which reduces a voltage level of the node n2 when a supply of the power supply voltage VCC to the power supply node T1 is stopped, a charge and discharge circuit (supply circuit) 101 which discharges the electrical charge stored in the condenser C11 in response to a falling of the node n2 when the supply of the power supply voltage to the power supply node T1 is stopped and which supplies the electrical charge from the power supply node T1 to the condenser C11 when the power supply voltage VCC is supplied to the power supply node T1, and a discharge circuit 103 which is located between the node n1 and the ground node T2 and which discharges the electrical charge stored in the condenser C11 to the ground node T2 during a set period after the supply of the power supply voltage VCC to the power supply node T1 is started. The node n1 is electrically connected to an output circuit which outputs an output signal when a voltage level of the node n1 exceeds a set voltage level after the set period.

Figure 2:
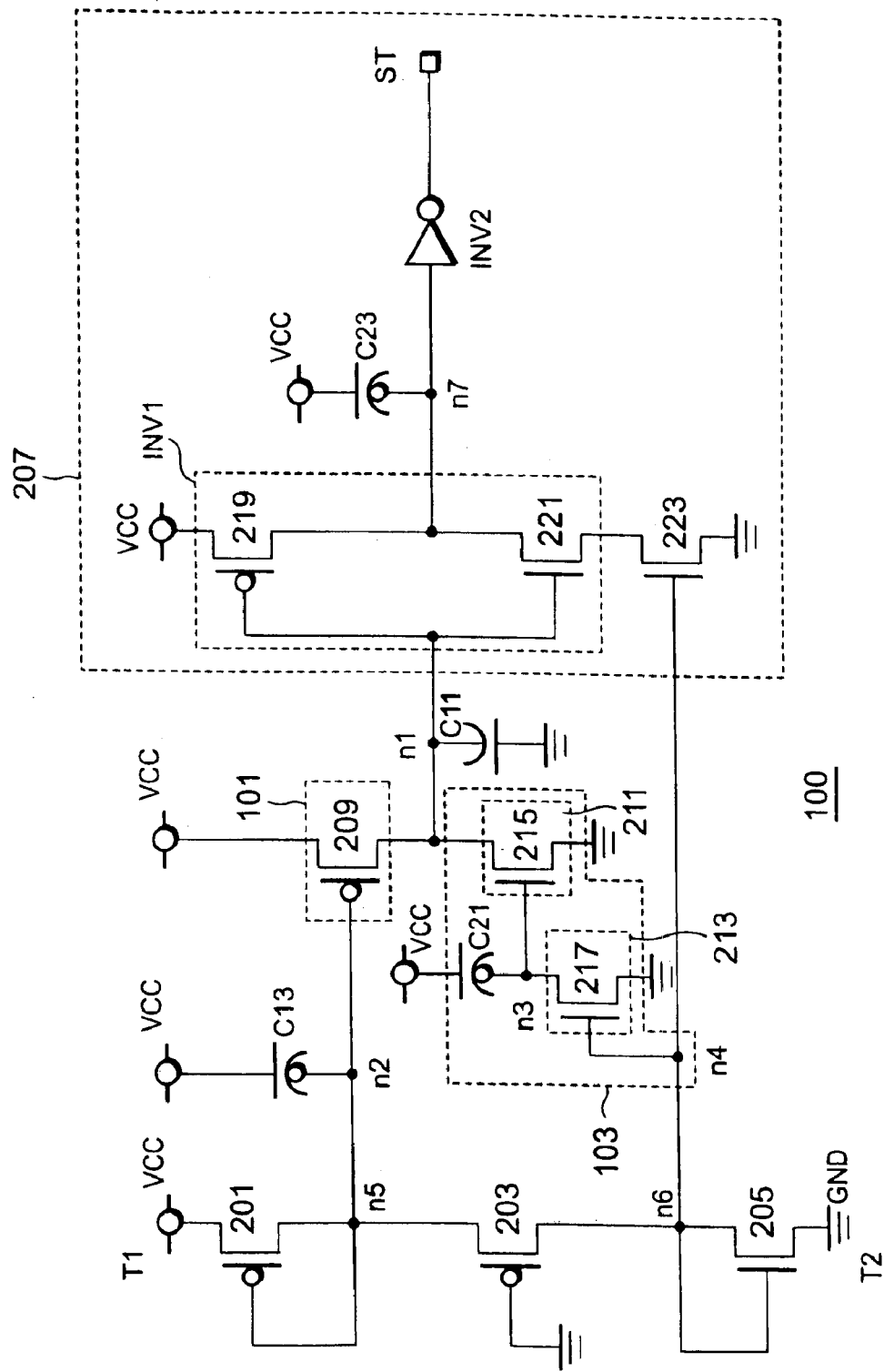
FIG. 2 is a whole circuit diagram of the start-up circuit according to the preferred embodiment of the present invention.

FIG. 2 is a whole circuit diagram of the start-up circuit according to the preferred embodiment of the present invention. As shown in FIG. 2, the start-up circuit 100 further includes a PMOS transistors 201, a node n5, a PMOS transistor 203, a node n6 and an NMOS transistor 205 which are located between the power supply node T1 and the ground node T2 in series, and which control the amount of a current flowing in the start-up circuit 100. The start-up circuit 100 shown in FIG. 2 includes an output circuit 207 electrically connected to the node n1, and which outputs the output signal when a voltage level of the node n1 exceeds a set voltage level after the set period.

The PMOS transistor 201 is located between the power supply node T1 and the node n5, and has control gate and first (source) electrodes which are electrically connected to the node n5 and a second (drain) electrode which is electrically connected to the power supply node T1. The PMOS transistor 203 is located between the nodes n5 and n6, and has a control gate electrode which is electrically connected to the ground node T2, a first (source) electrode which is electrically connected to the node n5, and a second (drain) electrode which is electrically connected to the node n6. The NMOS transistor 205 is located between the node n6 and the ground node T2, and has a first electrode which is electrically connected to the ground node T2, and control gate and first (drain) which are electrically connected to the node n6. PMOS transistors 201 and 203 and NMOS transistor 205 assume an ON state when a voltage level of the power supply node T1 rises due to a supply of the power supply voltage VCC to the power supply node T1. As a result, a minute current flows between the power supply and ground nodes T1 and T2. Therefore, voltage levels of the nodes n5 and n6 are fixed, respectively.

The charge and discharge circuit (supply circuit) 101 includes a PMOS transistor 209 having a control gate electrode which is electrically connected to the node n2, a first (source) electrode which is electrically connected to power supply node T1, and a second (drain) electrode which is electrically connected to the node n1. ON and OFF states of the PMOS transistor 209 are determined in accordance with a voltage level of the node n2.

The condenser C11 is, for example, an NMOS capacitor. The condenser C11 is charged with an electrical voltage from the power supply node T1 after the power supply voltage VCC is supplied from the power supply node T1 through the PMOS transistor 209. Then, the PMOS transistor 209 is an ON state. A charging speed of the condenser C11 is determined in accordance with a time constant, based on a capacity of the condenser C11 and an ON state resistance of the PMOS transistor 209.

The discharge circuit 103 includes a node n3, a condenser C21 which is located between the power supply node T1 and the node n3 and which rises to a voltage level of the node n3 when a supply of the power supply voltage VCC to the power supply node T1 is started, a node n4, a reduction circuit 213 which is located between the node n3 and the ground node T2 and which reduces a voltage level of the node n3 in response to a voltage level of the node n4, and a switch circuit 211 which is located between the node n1 and the ground node T2 and which switches on in response to a rising of the voltage level of the node n3 and switches off in response to a falling of the voltage at the node n3.

The condenser C21 is, for example, a PMOS capacitor. The switch circuit 211 includes an NMOS transistor 215 having a control gate electrode which is electrically connected to the node n3, a first (source) electrode which is connected to the ground node T2, and a second (drain) electrode which is electrically connected to the node n1. The reduction circuit 213 includes an NMOS transistor 217 having a control gate electrode which is electrically connected to the node n4, a first (source) electrode which is electrically connected to the ground node T2, and a second (drain) electrode which is electrically connected to the node n3.

The output circuit 207 includes a node n7, an inverter INV1 which outputs a reversal signal to the node n7 in response to the voltage level of the node n1, an NMOS transistor 223 which is located between the inverter INV1 and the ground node T2 and which decides a driving capacity of the inverter INV1, a condenser C23 which is located between the power supply node T1 and the node n7 and which raises a voltage level of the node n7 when the supply of the power supply voltage VCC to the power supply node T1 is started, an inverter INV2 which outputs a reversal signal in response to the voltage level of the node n7, and an output node ST which outputs a start-up signal to an internal circuit.

The inverter INV1 includes PMOS and NMOS transistors 219 and 221. The PMOS transistor 219 has a control gate electrode which is electrically connected to the node n1, a first (source) electrode which is electrically connected to the power supply node T1, and a second (drain) electrode which is electrically connected to the node n7. The NMOS transistor 221 has a control gate electrode which is electrically connected to the node n1, a first (source) electrode which is electrically connected to a source electrode of the NMOS transistor 223, and a second (drain) electrode which is electrically connected to the node n7. The NMOS transistor 223 has a control gate electrode which is electrically connected to the node n4, a first (source) electrode which is electrically connected to the ground node T2, and a second (drain) electrode which is electrically connected to the source electrode of the NMOS transistor 221.

The PMOS transistors 201 and 203 and NMOS transistor 205 control the amount of a current flowing in the start-up circuit 100. Specifically, the transistors 201, 203 and 205 control the amount of the current flowing in the PMOS transistor 209 and the NMOS transistor 223. The voltage level of the node n4 when the power supply voltage VCC is supplied to the power supply node T1, is decided on the basis of an ON resistance of the transistors 201, 203 and 205.

The PMOS transistor 201 and the PMOS transistor 209 form a current mirror. The NMOS transistor 205 and the NMOS transistor 223 form a current mirror. In the preferred embodiment, dimensions of the PMOS transistors 201 and 209 are set such that the same amount of current flows in the PMOS transistors 201 and 209 when the power supply voltage VCC is supplied to the power supply node T1. A dimension of the PMOS transistor 203 is set such that a minute current flows in the PMOS and NMOS transistors 201 and 205 when the PMOS and NMOS transistors 201 and 205 are in an ON state. Dimensions of the NMOS transistors 205 and 223 are set such that the same amount of current flow in the NMOS transistors 205 and 223 when the power supply voltage VCC is supplied to the power supply node T1. As a result, since a minute current flows in the PMOS transistor 201 when the power supply voltage VCC is supplied to the power supply node T1, a minute current also flows in the PMOS transistor 209. Therefore, since a minute current flows into the node n1, a charge period of the condenser C11 can be sufficiently secured.

As mentioned above, the NMOS transistor 223 and the NMOS transistor 205 form a current mirror. As a result, since a minute current flows in the NMOS transistor 205 when the power supply voltage VCC is supplied to the power supply node T1, a minute current flows in the NMOS transistor 223. Therefore, since a minute current flows in the NMOS transistor 221 when the voltage level of the node n1 exceeds the set voltage level, a desired period required for the voltage level of the node n7 to reach a low "L" level can be secured. Specifically, a desired period until the start-up signal (high "H" level signal) is outputted from the output node ST can be sufficiently secured.

The condenser C23 is, for example, a PMOS capacitor. The condenser C23 rises the voltage level of the node n7 when the supply of the power supply voltage VCC to the power supply node T1 is started. The internal circuit electrically connected to the output node ST is initialized during a period until the start-up signal ("H" level signal) is outputted from the output node ST.

Figure 3:
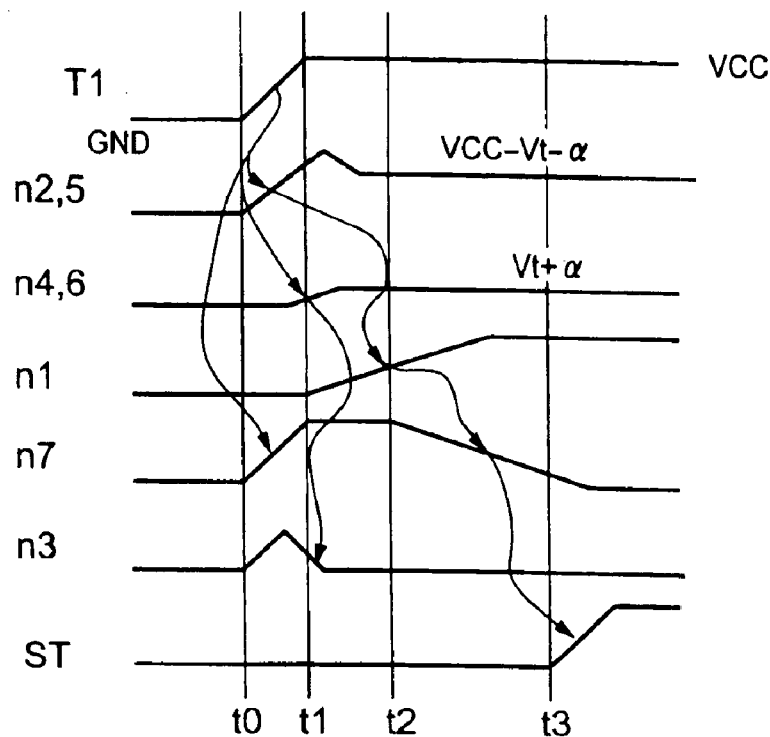
FIG. 3 is a voltage waveform showing voltage levels of various nodes when an electrical charge is charged into a condenser of the start-up circuit according to the preferred embodiment of the present invention.

FIG. 3 is a voltage wave form showing voltage levels of various nodes when an electrical charge is charged into the condenser C11 of the start-up circuit 100, according to the preferred embodiment of the present invention. Specifically, FIG. 3 shows voltage waveforms of the power supply node T1, the nodes n1 through n7, and the output node ST. FIG. 3 shows a relationship between an electrical change of the various nodes (along a vertical axis) and time (along a horizontal axis).

At first, all voltage levels of the nodes n1 through n7 and the output node ST, are at the ground voltage GND level before the power supply voltage VCC is supplied to the power supply node T1.

At a time t0, the voltage level of the power supply node T1 rises when the power supply of the power supply voltage VCC to the power supply node T1 is started, and the PMOS transistor 201 becomes an ON state, and the voltage level of the node n5 rises. Next, the PMOS transistor 203 switches to an ON state in response to the voltage level of the node n5, and the voltage level of the node n6 rises, and the NMOS transistor 205 switches to an ON state in response to the voltage level of the node n6. As a result, since a minute current flows between the power supply node T1 and the ground node T2 through the transistors 201, 203 and 205, the voltage levels of the nodes n5 and n6 are fixed, respectively. The voltage level of the node n5 is "VCC$-Vt_{(PMOS209)}-\alpha$", and the voltage level of the node n6 is "$Vt_{(NMOS217)}+\alpha$". The voltage level "VCC$-Vt_{(PMOS209)}-\alpha$" indicates that the voltage level between source and drain of the PMOS transistor 209 is higher than "a power supply voltage VCC−a threshold voltage $Vt_{(PMOS209)}$ of the PMOS transistor 209". The "$Vt_{(NMOS217)}+\alpha$" indicates that the voltage level between source and drain of the NMOS transistor 215 is higher than "a threshold voltage $Vt_{(NMOS217)}$ of the PMOS transistor 209". As a result, a current flowing in the transistors 201, 203 and 205 can be reduced as possible. The "$\alpha$" is, for example, one or a few tenths of a volt.

The voltage level of the node n3 rises due to the condenser C21, in accordance with following a rising of the power supply node T1. The voltage level of the node n7 rises due to the condenser C23, in accordance with following a rising of the power supply node T1.

At a time t1, an electrical charge flows into the node n1 through the PMOS transistor 209 when the voltage level of the node n5 reaches the level "VCC$-Vt_{(PMOS209)}-\alpha$", and the electrical charge starts to charge into the condenser C11. Since the electrical charge is charged into the condenser C11, the voltage level of the node n1 starts to rise. As noted above, the PMOS transistor 209 and the PMOS transistor 201 form a current mirror. Since the same amount of the minute current flows in the PMOS transistors 201 and 209, the voltage level of the node n1 rises gently. As a result, a period until the start-up signal ("H" level signal) is outputted from the output node ST can be sufficiently secured. Therefore, a period of initializing the internal circuit can be sufficiently secured.

The voltage level of the node n4 electrically connected to the node n6 becomes "$Vt_{(NMOS217)}+\alpha$", and as a result, the NMOS transistor 217 switches to an ON state. The voltage level of the node n3 which rose up the power supply voltage VCC level, falls to the ground voltage GND level. The NMOS transistor 215 switches to an OFF state in response to a falling of the node n3, and as a result, the node n1 and the ground node T2 are electrically disconnected during electrical charging of the condenser C11.

At a time t2, the PMOS transistor 219 switches to an OFF state and the NMOS transistor 221 switches to an ON state, when the voltage level of the node n1 exceeds a set voltage level (in response to a rising of the node n1). The NMOS transistor 223 is an ON state due to the voltage level "$Vt_{(NMOS217)}+\alpha$" of the node n4. Therefore, since the electrical charge of the node n7 flows to the ground node T2 through the NMOS transistors 221 and 223, the voltage level of the node n7 starts to fall. As noted above, the NMOS transistor 223 and the NMOS transistor 205 form a current mirror. Since the same amount of the minute current flow in the NMOS transistors 205 and 223, the voltage level of the node n7 falls gently. As a result, a period until the start-up signal ("H" level signal) is outputted from the output node ST can be sufficiently secured. Therefore, a period of initializing the internal circuit can be sufficiently secured.

At a time t3, the inverter INV2 begins to raise the voltage level of the output node ST, whereby the output node ST subsequently outputs the start-up signal ("H" level signal) to the internal circuit.

The voltage level of the output node ST keeps "L" level during a set period, and then changes to "H" level. The internal circuit is initialized during the period when the voltage level of the output node ST is "L" level. In order words, the internal circuit is initialized during a period from a beginning of the supply of the power supply voltage VCC to the power supply node T1, to an outputting of the start-up signal.

Figure 4:
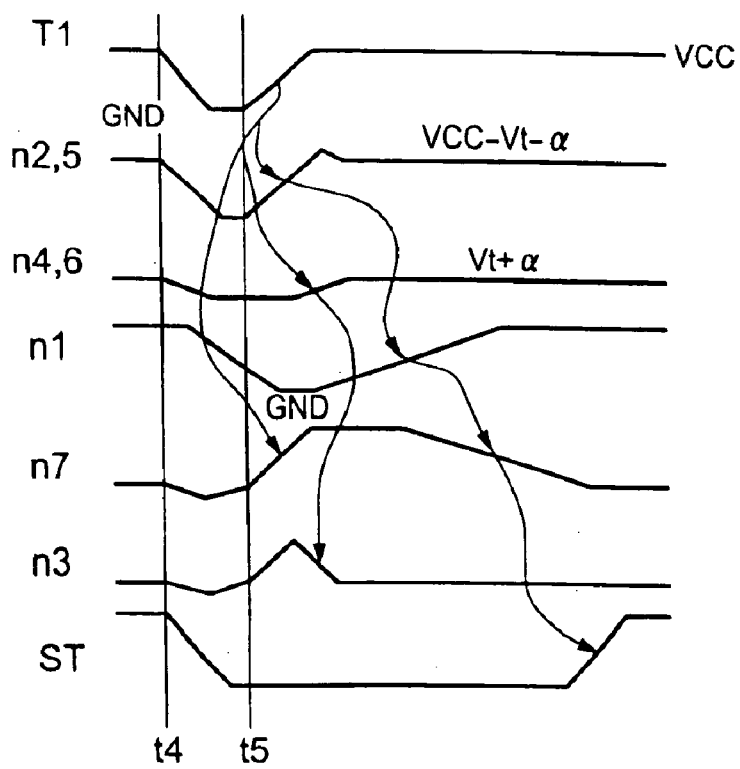
FIG. 4 is a voltage waveform showing voltage levels of various nodes when the electrical charge is discharged from the condenser of the start-up circuit according to the preferred embodiment of the present invention.
Figure 5:
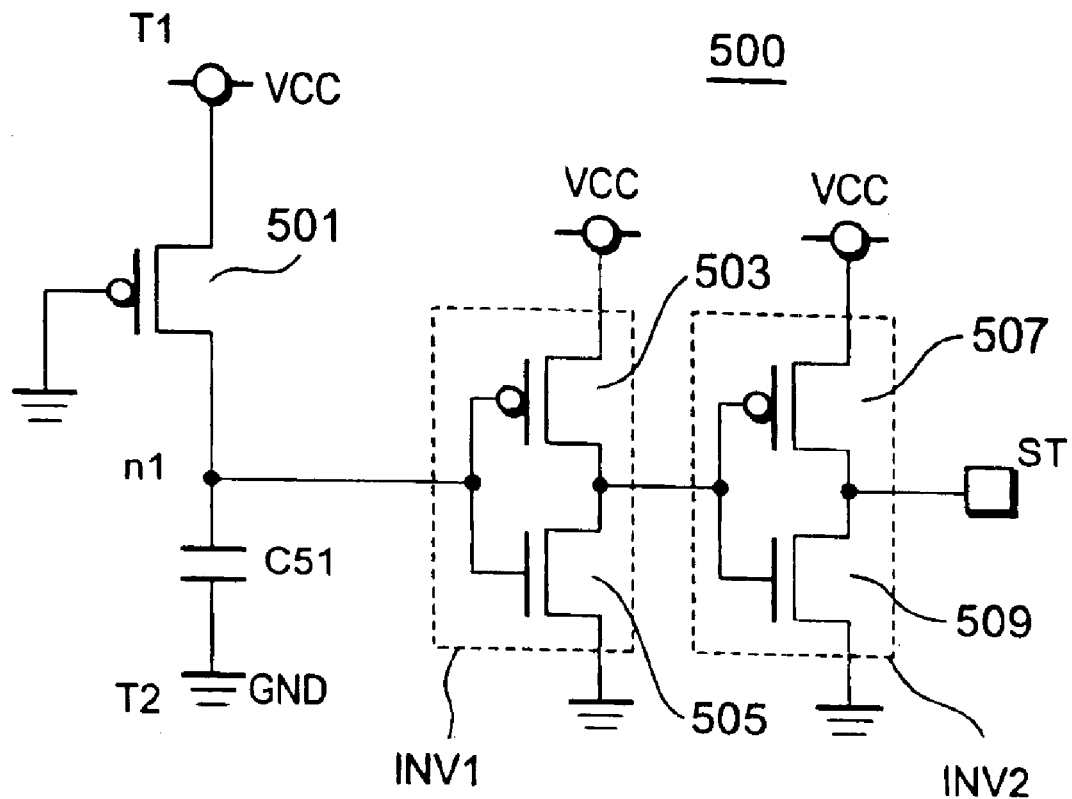
FIG. 5 is a circuit diagram of a conventional power saving integrated circuit.

FIG. 4 is a voltage wave form showing voltage levels of various nodes when an electrical charge is discharged from the condenser C11 of the start-up circuit 100, in the start-up circuit 100 according to the preferred embodiment of the present invention. Specifically, FIG. 4 shows voltage waveform of the power supply node T1, the nodes n1 through n7, and the output node ST. FIG. 4 shows a relationship between an electrical change of the various nodes (along a vertical axis) and a time (along a horizontal axis).

At first, all voltage levels of the nodes n2 and n5 are "$VCC-Vt_{(PMOS209)}-\alpha$", and the voltage level of the nodes n4 and n6 are "$Vt_{(NMOS217)}+\alpha$", before the supply of the power supply voltage VCC to the power supply node T1 is disrupted. Also, the voltage levels of the node n1 and the output node ST are the power supply voltage VCC level, and the voltage levels of the nodes n3 and n7 are the ground voltage GND level.

At a time t4, the voltage level of the power supply node T1 falls to the ground voltage GND level when the supply of the power supply voltage VCC to the power supply node T1 is disrupted, and the voltage level of the node n2 falls to under the ground voltage GND level. At that time, since the condenser C13 operates to keep the electrical charge, an electrical change of the node n2 is the same an electrical change of the power supply node T1. Therefore, since the first voltage level of the node n2 is "$VCC-Vt_{(PMOS209)}-\alpha$", the voltage level of the node n2 falls to under the ground voltage GND level in accordance with the electrical change.

The PMOS transistor 209 becomes an ON state in response to the voltage level of the node n2. As a result, the electrical charge stored in the condenser C11 is discharged to the power supply node T1 keeping the ground voltage GND level, and the voltage level of the node n1 falls.

At a time t5, the voltage level of the power supply node T1 starts to rise when the supply of the power supply voltage VCC to the power supply node T1 is resumed. The voltage of the node n3 rises due to the condenser C21, in accordance with a rising of the power supply node T1. As a result, the NMOS transistor 215 switches to an ON state, and the node n1 and the ground node T2 are electrically connected.

Therefore, the electrical charge remaining in the condenser C11 is discharged to the ground node T2, and the voltage level of the node n1 falls to the ground voltage GND level.

Next, the voltage level of the node n6 rises, and the voltage level of the node n4 which is electrically connected to the node n6 rises. As a result, the NMOS transistor 217 switches to an ON state, and the node n3 and the ground node T2 are electrically connected. Further, the voltage level of the node n3 falls, and the NMOS transistor 215 switches to an OFF state.

According to the preferred embodiment of the present invention, since the start-up circuit 100 includes the condenser C13, the charge and discharge circuit 101 and the discharge circuit 103, the electrical charge stored in the condenser C11 can be quickly discharged to the power supply node T1 when the supply of the power supply voltage VCC to the power supply node T1 is disrupted. Also, the electrical charge remaining in the condenser C11 can be quickly discharged to the ground node T2 when the supply of the power supply voltage VCC to the power supply node T1 is resumed. As a result, even through the supply of the power supply voltage VCC to the power supply node T1 is disrupted, a period of charging the electrical charge into the condenser C11 can be sufficiently secured. Therefore, a period of initializing the internal circuit electrically connected to the output node ST can be sufficiently secured.

As described above, the start-up circuit can quickly discharge the electrical charge stored in the condenser to the power supply node when the supply of the power supply voltage to the power supply node is disrupted. Also, the start-up circuit can quickly discharge the electrical charge remaining in the condenser to the ground node when the supply of the power supply voltage to the power supply node is resumed. As a result, even through the supply of the power supply voltage to the power supply node is disrupted, a period of charging the electrical charge into the condenser can be sufficiently secured. Therefore, a period of initializing the internal circuit electrically connected to the output node ST can be sufficiently secured.

The present invention has been described with reference to illustrative embodiments, however, this description must not be considered to be confined only to the embodiments illustrated. Various modifications and changes of these illustrative embodiments and the other embodiments of the present invention will become apparent to one skilled in the art from reference to the description of the present invention. It is therefore contemplated that the appended claims will cover any such modifications or embodiments as fall within the true scope of the invention.

What is claimed is:

1. A start-up circuit, comprising:
   a power supply node which receives a power supply voltage;
   a ground node which receives a ground voltage;
   a first node;
   a first capacitor which is connected between the first node and the ground node;
   a second node;
   a second capacitor which is connected between the power supply node and the second node, and which reduces a voltage level of the second node when a supply of the power supply voltage to the power supply node is stopped;
   a control circuit which includes a PMOS transistor and an NMOS transistor, wherein a source electrode of the PMOS transistor is connected to the power supply node, wherein a drain electrode and a control electrode of the PMOS transistor connected to the second node, and wherein the NMOS transistor is connected in series between the second node and the ground node;

a charge and discharge circuit which is connected between the power supply node and the first node, and which discharges an electrical charge stored in the first capacitor to the power supply node in response to a falling of the voltage level of the second node when the supply of the power supply voltage to the power supply node is stopped, and which supplies an electrical charge from the power supply node to the first capacitor when the supply of the power supply voltage to the power supply node is started;

a discharge circuit which is located between the first node and the ground node, and which discharges an electrical charge stored in the first capacitor to the ground node during a set period after the supply of the power supply voltage to the power supply node is started, wherein the discharge circuit comprises a third node, a third capacitor which raises a voltage level of the third node when the supply of the power supply voltage to the power supply node is started, and a switch circuit which electrically connects the first node and the ground node in response to a rising of the voltage level of the third node; and an output circuit which is connected to the first node, and which outputs a start-up signal when a voltage level of the first node becomes higher than a set voltage level.

2. The start-up circuit of claim 1, wherein the PMOS transistor of the control circuit is a first PMOS transistor, and wherein the control circuit further comprises a second PMOS transistor connected in series between the first PMOS transistor and the NMOS transistor.

3. The start-up circuit of claim 2, wherein a source of the NMOS transistor is connected to the ground node, wherein a control electrode and a drain electrode of the NMOS transistor is connected to a fourth node, wherein a drain of the second PMOS transistor is connected to the first node, wherein a control electrode of the second PMOS transistor is connected to the ground node, and wherein a source electrode of the second PMOS transistor is connected to the second node.

4. The start-up of claim 1, wherein the PMOS transistor of the control circuit is a first PMOS transistor, and wherein the charge and discharge circuit comprises a second PMOS transistor.

5. The start-up circuit of claim 4, wherein a control electrode of the second PMOS transistor is connected to the second node, wherein a drain electrode of the second PMOS transistor is connected to the first node, and wherein a source electrode of the second PMOS transistor is connected to the power supply node.

6. The start-up circuit of claim 3, wherein the charge and discharge circuit comprises a third PMOS transistor, wherein a control electrode of the third PMOS transistor is connected to the second node, wherein a drain electrode of the third PMOS transistor is connected to the first node, and wherein a source electrode of the third PMOS transistor is connected to the power supply node.

7. The start-up circuit of claim 1, wherein the NMOS transistor of the control circuit is a first NMOS transistor, and wherein the switch circuit comprises a second NMOS transistor connected in series between the first node and the ground node, and having a control electrode connected to the third node.

8. The start-up circuit of claim 3, wherein the switch circuit of the discharge circuit is a first switch circuit, and wherein the discharge circuit further comprises a second switch circuit connected between the third node and the ground node.

9. The start-up circuit of claim 8, wherein the NMOS transistor of the control circuit is a first NMOS transistor, wherein the first switch circuit comprises a second NMOS transistor connected in series between the first node and the ground node, and having a control electrode connected to the third node, and wherein the second switch circuit comprises a third NMOS transistor connected in series between the third node and the ground node, and having a control electrode connected to the fourth node.

10. The start-up circuit of claim 1, wherein the output circuit comprises an inverter having an input connected to the first node.

11. The start-up circuit of claim 1, wherein the output circuit comprises a first inverter having an input connected to the first node and an output connected to a fourth node, a second inverter having an input connected to the fourth node and an output connected to an output node, and a capacitor connected between the fourth node and the power supply node.

12. The start-up circuit of claim 3, wherein NMOS transistor of the control circuit is a first NMOS transistor, and wherein the output circuit comprises a third PMOS transistor and second and third NMOS transistors, wherein a source electrode of the third PMOS transistor is connected to the power supply node, wherein an drain electrode of the third PMOS transistor is connected to a fifth node, wherein control electrodes of the third PMOS transistor and the second NMOS transistor are connected to the first node, wherein a source electrode of the second NMOS transistor is connected to the fifth node, wherein a drain electrode of the second NMOS transistor is connected to a drain electrode of the third NMOS transistor, wherein a source electrode of the third NMOS transistor is connected to the ground node, and wherein a control electrode of the third NMOS transistor is connected to the fourth node.

* * * * *